(12) United States Patent
Ryu et al.

(10) Patent No.: US 6,514,779 B1
(45) Date of Patent: Feb. 4, 2003

(54) LARGE AREA SILICON CARBIDE DEVICES AND MANUFACTURING METHODS THEREFOR

(75) Inventors: Sei-Hyung Ryu, Cary, NC (US); Anant Agarwal, Chapel Hill, NC (US); Craig Capell, Durham, NC (US); John W. Palmour, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 09/981,523

(22) Filed: Oct. 17, 2001

(51) Int. Cl.[7] .......................... G01R 31/26; H01L 21/66
(52) U.S. Cl. ............................ 438/17; 438/14; 438/15; 438/105; 438/133; 438/197; 438/309
(58) Field of Search ................... 438/14, 17, 15, 438/105, 197, 133, 309

(56) References Cited

U.S. PATENT DOCUMENTS

| | | | |
|---|---|---|---|
| 4,387,503 A | 6/1983 | Aswell et al. | 29/575 |
| 4,543,594 A | 9/1985 | Mohsen et al. | 357/51 |
| 4,605,872 A | 8/1986 | Rung | 341/118 |
| 4,777,471 A | 10/1988 | Comer | 341/118 |
| 4,779,126 A | 10/1988 | Herman | 357/38 |
| 4,799,126 A | 1/1989 | Kruse et al. | 361/101 |
| 4,860,185 A | 8/1989 | Brewer et al. | 363/41 |
| 4,885,477 A | 12/1989 | Bird et al. | 307/296.8 |
| 4,894,791 A | 1/1990 | Jiang et al. | 364/570 |
| 4,910,508 A | 3/1990 | Yamazaki | 340/825 |
| 5,021,861 A | 6/1991 | Baliga | 357/51 |
| 5,539,217 A | 7/1996 | Edmond et al. | 257/77 |
| 5,663,580 A | 9/1997 | Harris et al. | 257/77 |
| 5,883,403 A | 3/1999 | Ishikawa et al. | 257/156 |

OTHER PUBLICATIONS

M. Stoisiek, et al. *A Large Area MOS–GTO With Wafer Repair Technique*. Siemens AG, Corporate Research Laboratories, 1987, pp. 666–669.
J. Tihanyi, et al. *Functional Integration of Power MOS and Bipolar Devices*. IEEE, 1980, pp. 75–78.
B. Jayant Baliga, "Power Metal–Oxide–Semiconductor Field–Effect Transistors." *Modern Power Devices*.

*Primary Examiner*—Long Pham
(74) *Attorney, Agent, or Firm*—Myers Bigel Sibley & Sajovec, P.A.

(57) ABSTRACT

A silicon carbide device is fabricated by forming a plurality of a same type of silicon carbide devices on at least a portion of a silicon carbide wafer in a predefined pattern. The silicon carbide devices have corresponding first contacts on a first face of the silicon carbide wafer. The plurality of silicon carbide devices are electrically, tested to identify ones of the plurality of silicon carbide devices which pass an electrical test. The first contact of the identified ones of the silicon carbide devices are then selectively interconnected. Devices having a plurality of selectively connected silicon carbide devices of the same type are also provided.

15 Claims, 11 Drawing Sheets

LARGE AREA SILICON CARBIDE DEVICES AND MANUFACTURING METHODS THEREFOR

STATEMENT OF GOVERNMENT INTEREST

The present invention was developed, at least in part, under Office of Naval Research/DARPA contract # N00014-99-C-0377, and U.Ss Air Force (AFRL) contract # F33615-00-2-2004. The Government may have certain rights in this invention.

FIELD OF THE INVENTION

This invention relates to microelectronic devices and fabrication methods therefor, and more particularly to silicon carbide devices and manufacturing methods therefor.

BACKGROUND OF THE INVENTION

Silicon carbide (SiC) has been known for many years to have excellent physical and electronic properties which should theoretically allow production of electronic devices that can operate at higher temperatures, higher power and higher frequency than devices produced from silicon (Si) or GaAs. The high electric breakdown field of about $4 \times 10^6$ V/cm, high saturated electron drift velocity of about $2.0 \times 10^7$ cm/sec and high thermal conductivity of about 4.9 W/cm-°K indicate that SiC would be suitable for high frequency, high power applications. Unfortunately, difficulty in manufacturing has limited the usefulness of SiC for high power and high frequency applications.

Many different types of silicon carbide devices which may be suitable for differing high power applications have been described, including diodes, MOSFETs, MESFETs, JFETs and the like. See e.g. U.S. Patent Nos. 5,061,972, 5,264,713, 5,270,554, 5,506,421, 5,539,271, 5,686,737, 5,719,409, 5,831,288, 5,969,378, 6,011,279 and 6,121,633, the disclosures of which are incorporated herein by reference as if set forth fully herein. These devices may take advantage of the characteristics of silicon carbide to provide high power handling capabilities. While such silicon carbide devices may provide improved power handling capabilities over comparably sized silicon devices, it may be difficult to create large scale devices in silicon carbide. For example, in silicon a single device may be made on a wafer such that the device is substantially the same size as the wafer. However, manufacturing defect free silicon carbide wafers may be difficult, if not impossible. Thus, a device which consumes an entire wafer may have defects incorporated into the device which may limit its performance.

Figure 1:
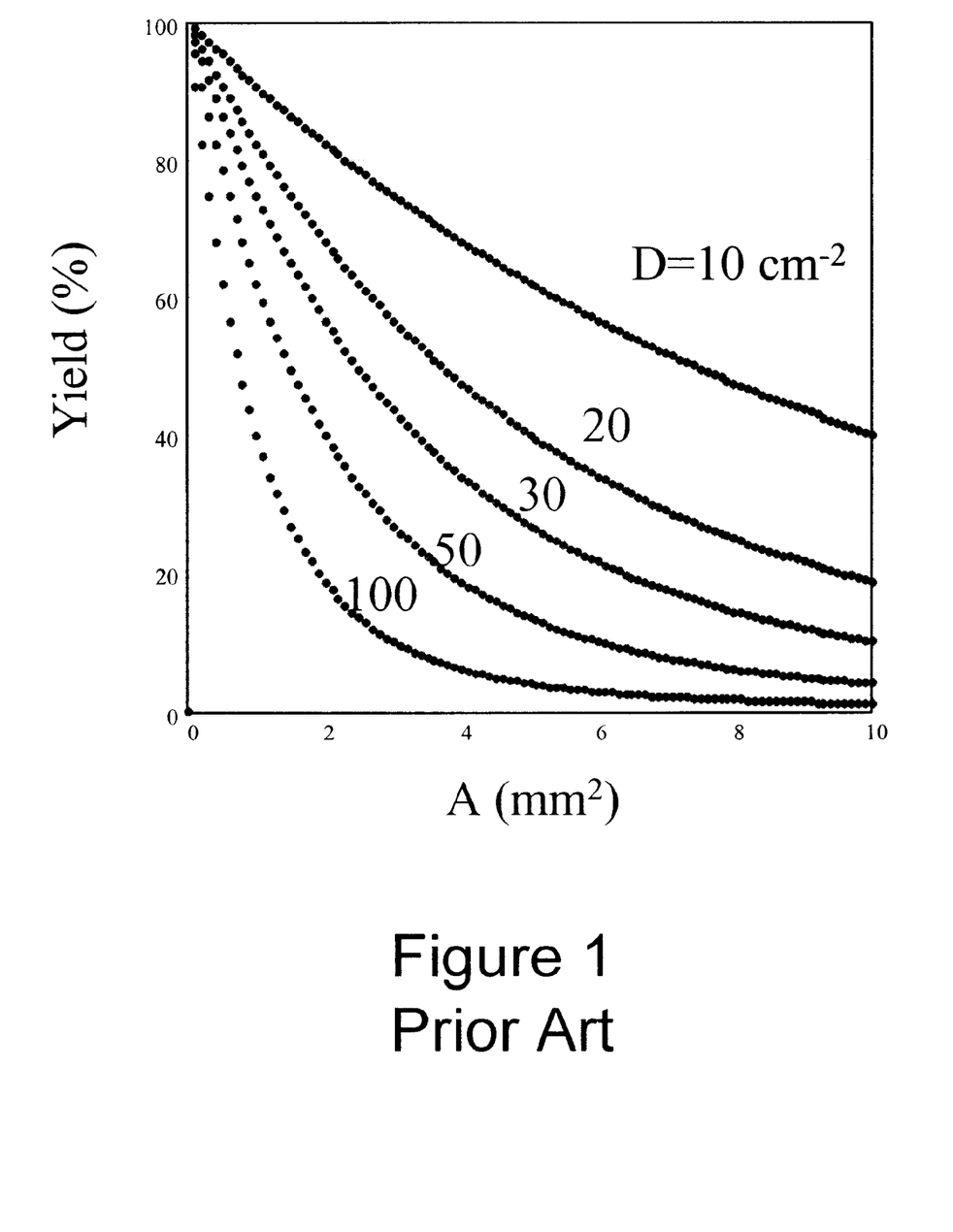
FIG. 1 is a graph of yield for silicon carbide devices.

For example, large area SiC power switches and/or diodes with a typical rating of 600V, 50–100 A are desired in many electric motor drive applications. However, as described above, it may not be practical to make SiC switches and/or diodes of the required rating in a single die. For example, at 100 A/cm², an active area of 7 mm×7 mm may be needed for a 50 A device. The device yield is typically limited by micropipe density as well as other defects such as dislocations, carrots, silicon inclusions, and processing defects etc. As illustrated in FIG. 1, assuming an all inclusive defect density of 20 cm$^{-2}$, the projected yield for a 2 mm×2 mm (4 A) die is ~50%. As is further illustrated in FIG. 1, the yield drops to less than 20% for a 3.3 mm×3.3 mm (10 A) die with the same overall defect density. The 50 A die will have a yield of ~1%.

Figure 2:
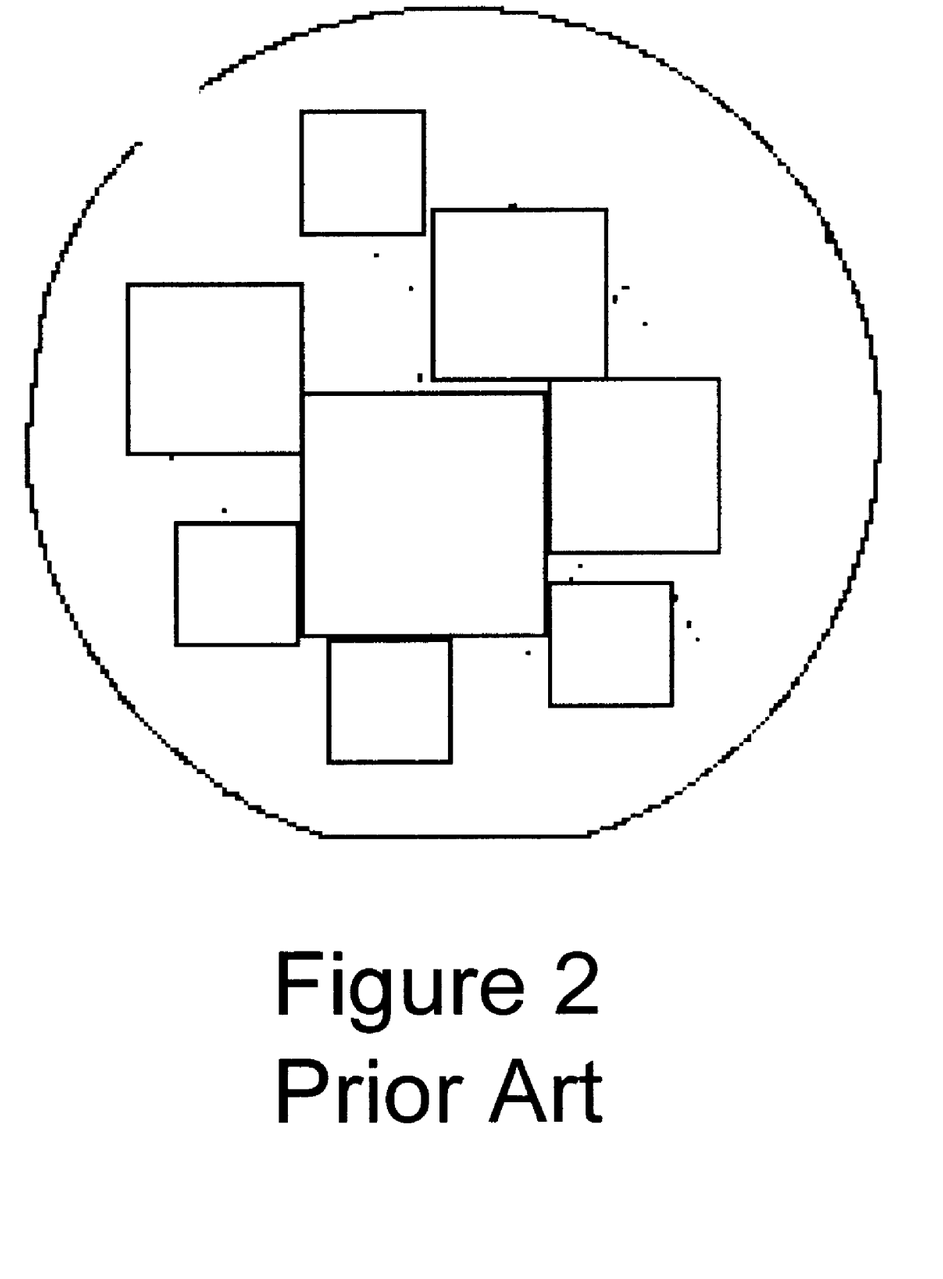
FIG. 2 is an illustration of a defect map utilized to locate devices in reduced defect areas of a silicon carbide wafer.

One conventional technique for obtaining higher yields of larger area devices is to selectively place devices in defect free sites or Micropipe Free Areas (MFA). Such identified sites are illustrated in FIG. 2. The MFA approach typically requires a separate mask set for each wafer and may be extremely tedious in terms of requiring custom maps for each wafer. In addition, the MFA approach considers micropipes as the only defect which is to be avoided, however, failure of a device may also be due to other defects. Accordingly, use of the MFA approach may not guarantee high yield.

Even with the rapid advancements in the materials technology, it is anticipated that it will still take a significantly long time to achieve cost-effective manufacturing of 50 to 100 A devices in a single die, using techniques described above.

SUMMARY OF THE INVENTION

Embodiments of the present invention provide silicon carbide devices and methods of fabricating silicon carbide devices by combining a plurality of a same type of silicon carbide devices on at least a portion of a silicon carbide wafer which are fabricated in a predefined pattern and utilizing a stepper mask to selectively interconnect those devices which pass an electrical test. The same stepper mask may be utilized for each of the plurality of silicon carbide devices such that devices. Thus, in particular embodiments of the present invention a stepper mask corresponding to one of the plurality of silicon carbide devices is selectively applied to ones of the plurality of silicon carbide diodes which are identified as having passed an electrical test. The stepper mask is applied for each of the identified silicon carbide devices.

In further embodiments of the present invention, the silicon carbide devices have first contacts on a first face of the silicon carbide wafer. The first contacts are selectively interconnected by forming a passivation layer on the silicon carbide devices which covers the first contacts, selectively forming openings in the passivation layer corresponding to first contacts for the identified ones of the plurality of silicon carbide devices and electrically connecting the first contacts through the selectively formed openings utilizing the stepper mask to open vias through the passivation layer.

In additional embodiments of the present invention, a device size is selected to provide an expected yield of devices in silicon carbide such that a sufficient number of devices in a region of the silicon carbide wafer containing a plurality of silicon carbide devices will pass the electrical test so as to provide a silicon carbide device having a selected operating capability. In such embodiments, the plurality of the same type of silicon carbide devices are formed to provide silicon carbide devices of the selected device size.

In still further embodiments of the present invention, the silicon carbide devices are vertical silicon carbide diodes. In such a case, the silicon carbide diodes have a commonly connected second contact. Furthermore, electrically testing the silicon carbide devices may be provided by electrically testing the reverse bias blocking voltage of the silicon carbide diodes to determine if the reverse bias blocking voltage of a silicon carbide diode exceeds a predefined voltage value.

In particular embodiments of the present invention, the plurality of silicon carbide devices are provided in a plurality of dies on the silicon carbide wafer. In such embodiments, the silicon carbide wafer may be diced to provide a plurality of chips. The chips would then have a plurality of selectively interconnected silicon carbide devices.

In other embodiments of the present invention, the plurality of silicon carbide devices are distributed across the silicon carbide wafer. In such embodiments, selectively interconnecting the devices may be provided by selectively interconnecting a sufficient number of the silicon carbide devices to provide a desired operating characteristic utilizing an overlay pad. The size of the overlay pad may be selected based on the desired operating characteristic and the number of the silicon carbide devices required to produce a silicon carbide device having the desired operating characteristic.

In still further embodiments of the present invention, the silicon carbide devices have a second contact on the first face of the silicon carbide wafer. In such a case, the second contacts of the identified ones of the silicon carbide devices may also be selectively interconnected. Furthermore, where the silicon carbide devices are vertical silicon carbide devices having a third contact on a second face of the silicon carbide wafer opposite the first face, the third contacts of the silicon carbide devices may also be connected in parallel. Such an interconnection of the third contacts may be provided by commonly connecting the third contacts of each of the silicon carbide devices.

In additional embodiments of the present invention, selectively interconnecting the first contact and selectively interconnecting second contacts is provided by forming a passivation layer on the silicon carbide devices which covers the first contacts, selectively forming openings in the passivation layer corresponding to first contacts for the identified ones of the plurality of silicon carbide devices, selectively forming openings in the passivation layer corresponding to second contacts for the identified ones of the plurality of silicon carbide devices, electrically connecting the first contacts through the selectively formed openings and electrically connecting the second contacts through the selectively formed openings. In such embodiments, selectively forming openings in the passivation layer corresponding to first contacts for the identified ones of the plurality of silicon carbide devices and selectively forming openings in the passivation layer corresponding to second contacts for the identified ones of the plurality of silicon carbide devices are provided by applying a stepper mask corresponding to one of the plurality of silicon carbide devices to an identified one of the plurality of silicon carbide devices. The stepper mask is applied for each of the identified silicon carbide devices.

Furthermore, electrically connecting the first contacts and electrically connecting the second contacts may be provided by electrically connecting the first contacts with a first interconnection metallization and electrically connecting the second contacts with a second interconnection metallization. In such embodiment an insulating layer may also be formed on the first interconnection metallization and the second interconnection metallization. At least one opening is formed in the insulator corresponding to the first interconnection metallization utilizing a stepper mask and a first contact pad formed on the insulating layer which contacts the first interconnection metallization through the at least one opening in the insulator corresponding to the first interconnection metallization. At least one opening is formed in the insulator corresponding to the second interconnection metallization and a second contact pad formed on the insulating layer which contacts the second interconnection metallization through the at least one opening in the insulator corresponding to the second interconnection metallization.

In particular embodiments of the present invention, the silicon carbide devices may be a metal-oxide semiconductor field effect transistor (MOSFET), a metal-semiconductor field effect transistor (MESFET), a junction field effect transistor (JFET), an insulated gate bipolar transistor (IGBT) and/or a bipolar junction transistor (BJT).

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Moreover, each embodiment described and illustrated herein includes its complementary conductivity type embodiment as well.

Referring now to the drawings, FIGS. 3, 4 and 6 through 10 are schematic partial top views and cross-sectional views of various embodiments of silicon carbide devices according to the present invention. Silicon carbide devices according to embodiments of the present invention may be formed of silicon carbide having a polytype of 3C, 2H, 4H, 6H, and 15R. In the illustrated embodiments, the $n^+$ and $n^-$ regions, as well as the $p^+$ and $p^-$, are designated "+" and "−" to symbolize different doping levels respectively of the same material in a manner well understood to those of ordinary skill in this art. The p-type silicon carbide is preferably doped with aluminum or boron and the n-type silicon carbide is preferably doped with nitrogen or phosphorous.

Embodiments of the present invention provide silicon carbide devices where a large number of smaller silicon carbide devices can be connected in parallel. A plurality of silicon carbide devices may be provided and electrically tested such that "good" cells may be defined as the cells that pass the electrical test, e.g., block the specified voltage in the forward direction (anode to cathode). Bad cells will fail the electrical test, e.g., not block the specified voltage due to the defects in the material, processing problems and/or other defects. The good cells may be selected by means of an electrical test or tests which are known to those of skill in the art.

The good cells may be selectively connected by selectively opening vias through an insulating layer to allow connection to contact(s) of the good cells while leaving the insulating layer in place for bad cells. In particular, photolithography through the use of a stepper mask may be utilized to connect only the good cells by exposing only the good cells such that a mask over contact regions of the good cells is removed and the mask remains over the contact regions of the bad cells. Alternatively, each of the cells could be connected prior to application of the stepper mask and the bad cells disconnected through the use of the stepper mask. Thus, the term "selectively connecting" is used here to refer to devices which are originally disconnected and are subsequently connected as well as devices which are originally connected and then subsequently disconnected.

Figure 3:
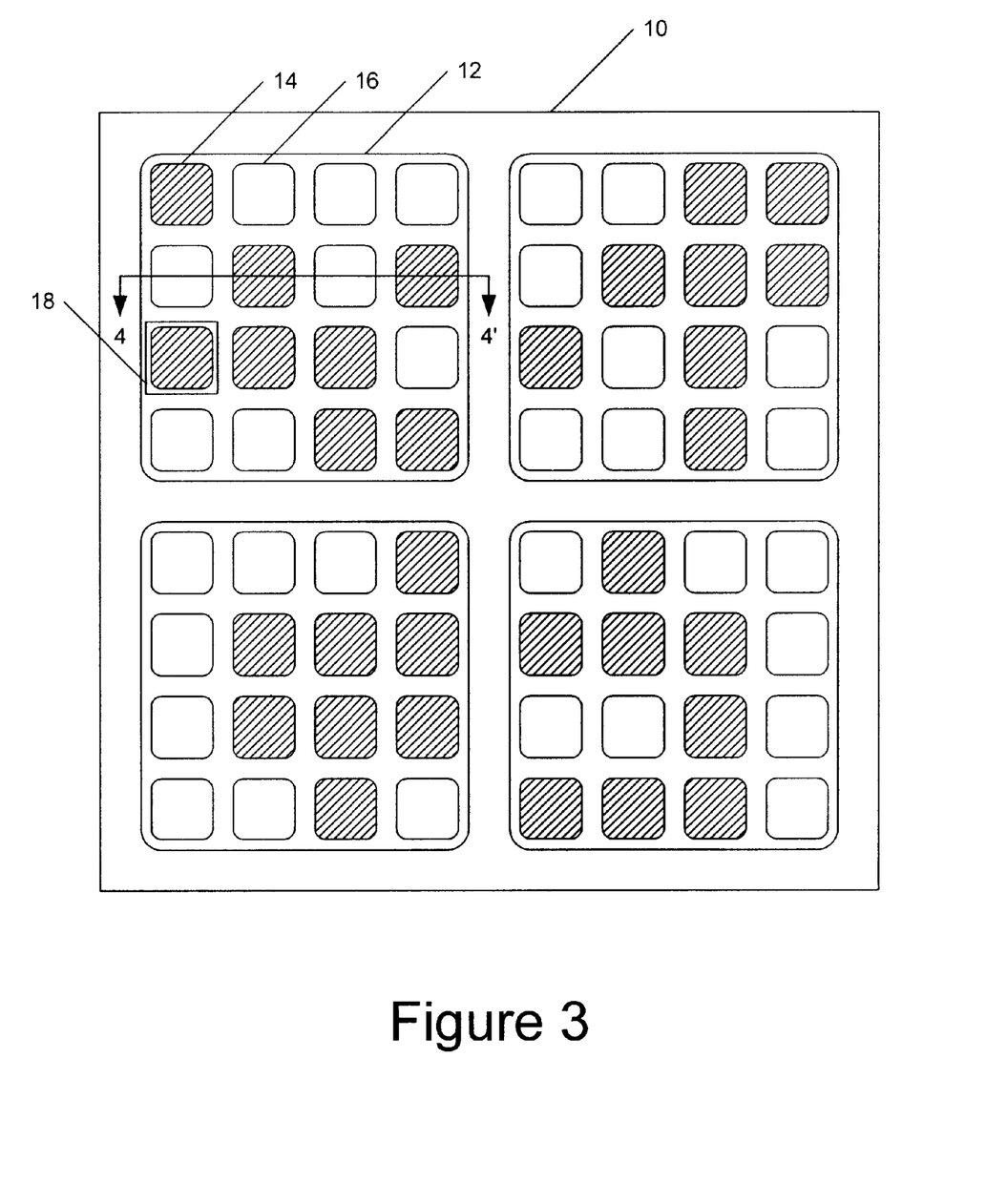
FIG. 3 is a top view of a silicon carbide diode according to embodiments of the present invention.
Figure 4:
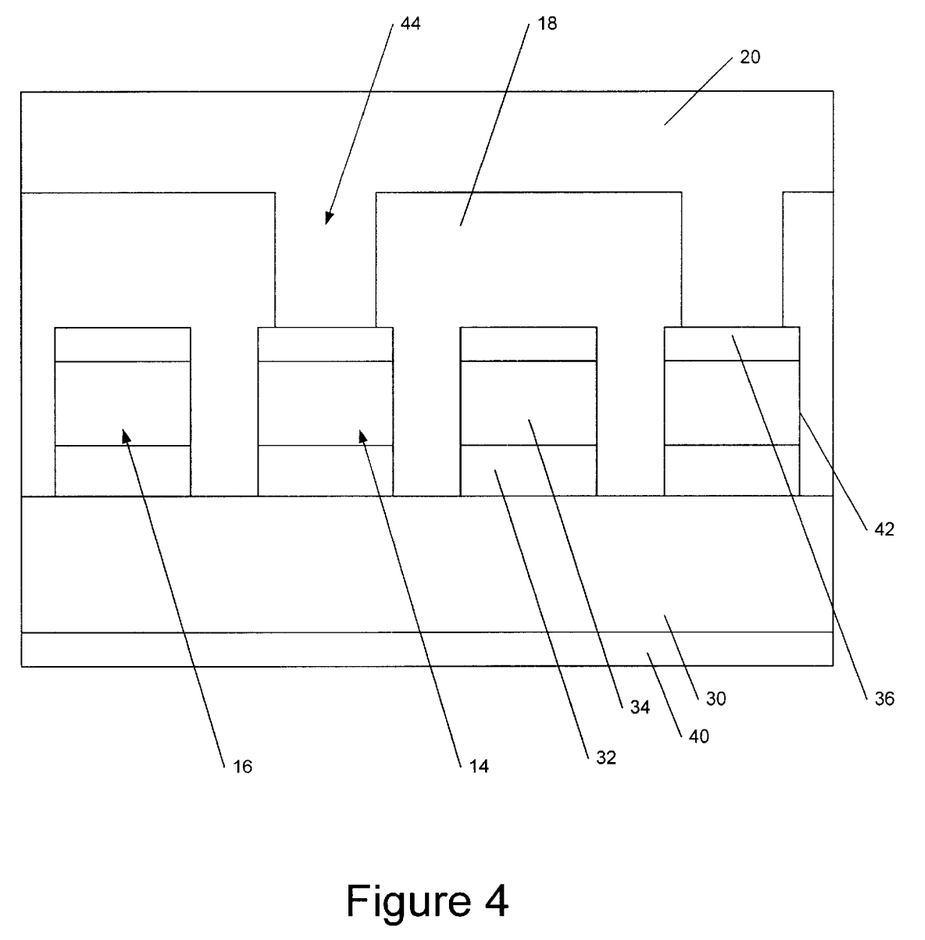
FIG. 4 is a cross-sectional view of an exemplary silicon carbide diode along lines 4—4' of FIG. 3 according to embodiments of the present invention.

Such an interconnection of selected cells of the plurality of diodes is illustrated in FIGS. 3 and 4. FIG. 3 is a top view of a wafer 10 having a plurality of dies 12 suitable for fabricating a two terminal silicon carbide device having a plurality of selectively interconnected silicon carbide devices, such as diodes, according to embodiments of the present invention. FIG. 4 is a cross-sectional view of a die 12 taken along lines 4—4' in FIG. 3. FIGS. 3 and 4 illustrate embodiments of the present invention where a plurality of silicon carbide diodes are provided on a wafer, a portion of a wafer or multiple wafers. As seen in FIG. 3, the wafer 10 may have a plurality of dies 12 each of which include a plurality of silicon carbide diodes 14 and 16. Each of the silicon carbide diodes 14 and 16 may be edge terminated, for example, by mesa edge termination, junction termination extension or the like. For example, the silicon carbide diodes 14 and 16 may have edge termination as described in commonly assigned U.S. patent application Ser. No. 09/723,710, entitled "EPITAXIAL EDGE TERMINATION FOR SILICON CARBIDE SCHOTTKY DEVICES AND METHODS OF FABRICATING SILICON CARBIDE DEVICES INCORPORATING SAME" which was filed Nov. 28, 2000, the disclosure of which is incorporated herein by reference as if set forth fully herein. Edge termination of the diodes 14 and 16 may provide isolation of the diodes in the die 12 from each other such that diodes which may have incorporated defects which may adversely affect their electrical properties may be isolated from diodes which do not incorporate such defects.

The silicon carbide diodes 14 and 16 are electrically tested to determine if the diodes pass an electrical test or tests, such as a blocking voltage test or other such electrical tests which evaluate the electrical properties of the diodes. Similarly, the electrical test or tests may include a "burn in" or other such reliability testing. In FIG. 3, diodes 14 which have passed the electrical test are illustrated as shaded and diodes 16 which have not passed the test are not shaded. The diodes 14 which have passed the electrical test are then interconnected in parallel while the diodes 16 which did not pass the electrical test are not interconnected.

Preferably, the plurality of diodes 14 and 16 are arranged on the die 12 and the dies 12 arranged on the wafer 10 in a predefined pattern. This pattern need not take into account the defects in the silicon carbide wafer 10 and may be the same pattern from wafer to wafer. The predefined pattern, however, preferably allows for electrical testing of the diodes in a die, via probing or other such in situ electrical testing procedures known to those of skill in the art, prior to formation of an interconnection structure to selectively interconnect the diodes which pass the electrical test or tests.

FIG. 4 is a cross-sectional view of a die 12 taken along the lines 4—4' of FIG. 3 where the silicon carbide diodes are Schottky diodes. While the diodes illustrated in FIG. 4 are illustrated as Schottky diodes, as will be appreciation by those of skill in the art, other types of diodes may also be utilized in embodiments of the present invention, such as "pn" junction diodes, Junction Barrier Schottky (JBS) diodes or the like. Thus, the structure of the diodes illustrated in FIG. 4 is provided for illustrative purposes and the present invention should not be construed as limited to such structures. For example, the diodes of U.S. patent application Ser. No. 09/723,710 referenced above may also be utilized while still benefiting from the teachings of the present invention.

As seen in FIG. 4, a plurality of silicon carbide diodes include an $n^+$ silicon carbide substrate 30, an n+ epitaxial layer 32 of silicon carbide on the substrate 30 and an $n^-$ epitaxial layer 34 of silicon carbide on the $n^+$ epitaxial layer 32. A Schottky contact 36 is provided on the n epitaxial layer 34. A second, ohmic contact 40 is provided on the silicon carbide substrate 30 opposite the layer of silicon carbide 32. As is further seen in FIG. 4, the diodes are mesa edge terminated such that a sidewall 42 of the mesa extends substantially to or into the substrate 30. Alternatively, or in addition to mesa edge termination, a guard ring or other type of edge termination may also be utilized.

An insulating layer 18 is provided on the diodes and vias 44 are selectively provided through the insulating layer 18 to the contacts 36 of diodes which have passed the electrical testing. The vias 44 may be provided by selective etching or selective growth. For example, a via 44 is provided to the contact 36 of diode 14 but a via is not provided to the contact 36 of diode 16. An interconnection metal 20, such as titanium, platinum, gold, aluminum, copper, silver or combinations thereof, is provided in the vias 44 so as to make electrical connection to only the selected ones of the diodes. The insulating layer may be $SiO_2$, $Si_3N_4$, Oxide-Nitride-Oxide, Oxynitride or the like. For example, suitable insulating layers are described in commonly assigned U.S. patent application Ser. No. 09/878,442, entitled "HIGH VOLTAGE, HIGH TEMPERATURE CAPACITOR STRUCTURES AND METHODS OF FABRICATING SAME", filed Jun. 11, 2001, the disclosure of which is incorporated herein by reference as if set forth fully herein.

Figure 5:
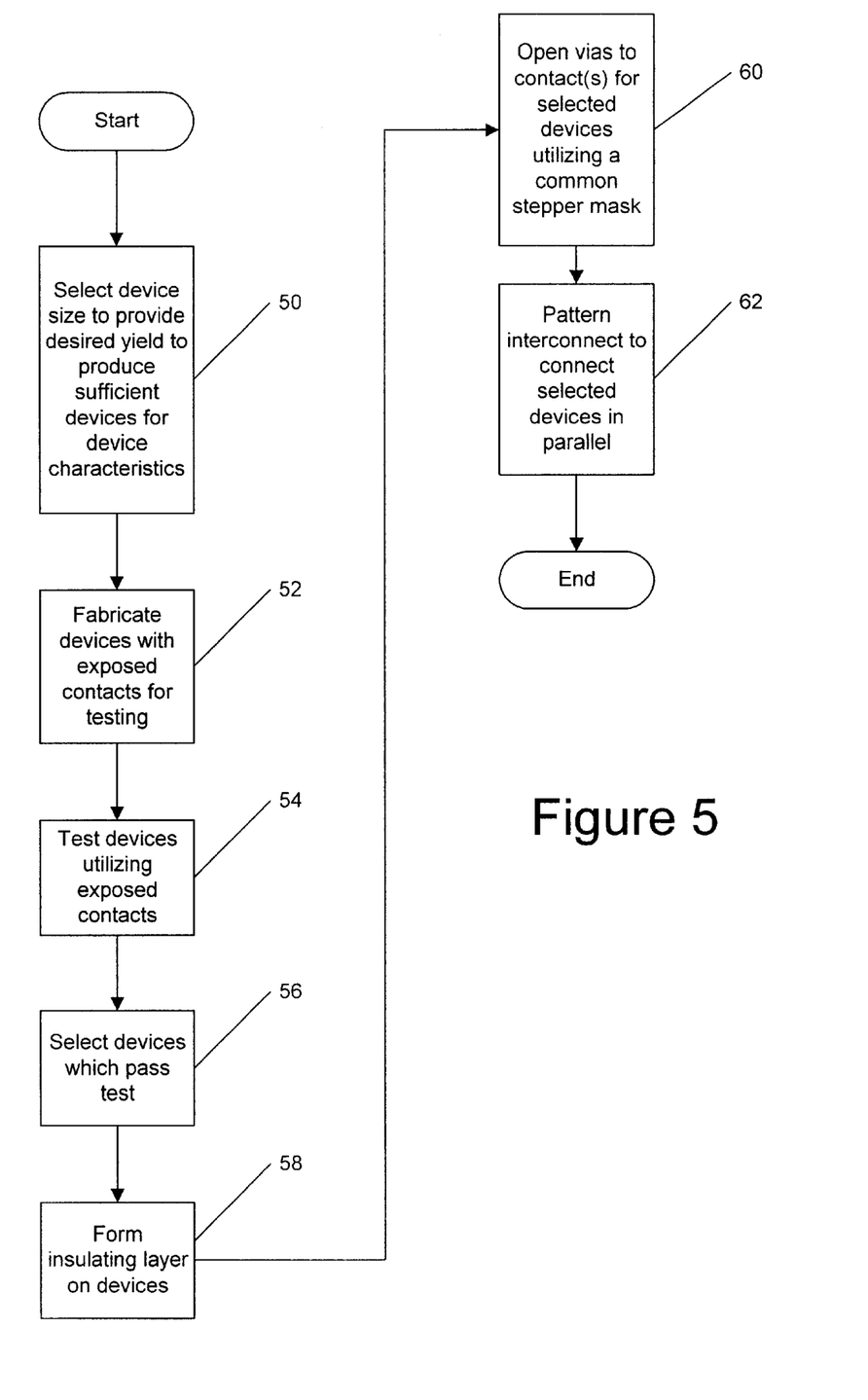
FIG. 5 is a flowchart illustrating operations according to embodiments of the present invention.

Embodiments of the present invention will now be described with reference to FIG. 5, which is a flowchart illustrating operations according to embodiments of the present invention. As seen in FIG. 5, a device size is selected which provides sufficient silicon carbide devices on at least a portion of a wafer to provide a desired device characteristic, such as a desired current handling capability (block 50). Such a device size may be determined, for example, by determining how many individually isolated devices of a given size may be provided on the portion of the silicon carbide wafer and what percentage yield would be associated with such devices. It may then be determined if a sufficient number of devices on the portion of the silicon carbide wafer would be expected to be of sufficient quality so as to provide the desired number of devices which may be interconnected in parallel to provide the desired operating characteristic (e.g. current handling capability).

The devices of the selected size are fabricated with contacts provided so as to allow for testing of the devices on the wafer (block 52). The devices are tested utilizing the exposed contacts (block 54) and devices which pass the electrical test are selected for interconnection (block 56). An insulating layer is formed on the exposed contacts of all of the devices on the portion of the wafer (block 58). Vias are then opened through the insulating layer corresponding to the selected devices (block 60) and interconnect metal is formed in the vias and on the insulating layer and patterned to connect the selected devices (block 62). Alternatively, a selectively grown insulating layer may be provided to isolate the non-selected devices. The diodes may have a common contact on one side of the devices and a separate contact for each device on the other side of the devices.

As an example of the above described operations, the devices described above may be placed in a predefined pattern on the silicon carbide wafers to provide one or more dies of devices. Through the utilization of a predefined pattern, the devices may be tested utilizing automatic electrical testing equipment. A map of the good cells may be transmitted to a stepper electronically. The wafers are then coated with a thick passivation layer, such as $SiO_2$ and $Si_3N_4$. This passivation layer should be thick enough to block the breakdown voltage of the good cells. Next, a stepper mask containing a "via layer" mask for a single cell is used to open the vias on the good cells already identified by electrical testing. The same via layer mask may be used for opening vias for all of the good devices by sequentially opening vias utilizing the map of good devices. Good devices are then connected by depositing an overlay metal. This overlay metal connects the good cells in parallel while the bad cells are isolated by the thick passivation layer. It should be noted that the approach of the present invention may be highly scalable. For example, an entire wafer can be used as a single part or differing size portions of the wafer may be used as a dies which are diced to provide corresponding chips with a plurality of interconnected devices. The current rating of the composite device will typically be determined by the size of the diced chip.

Figure 6:
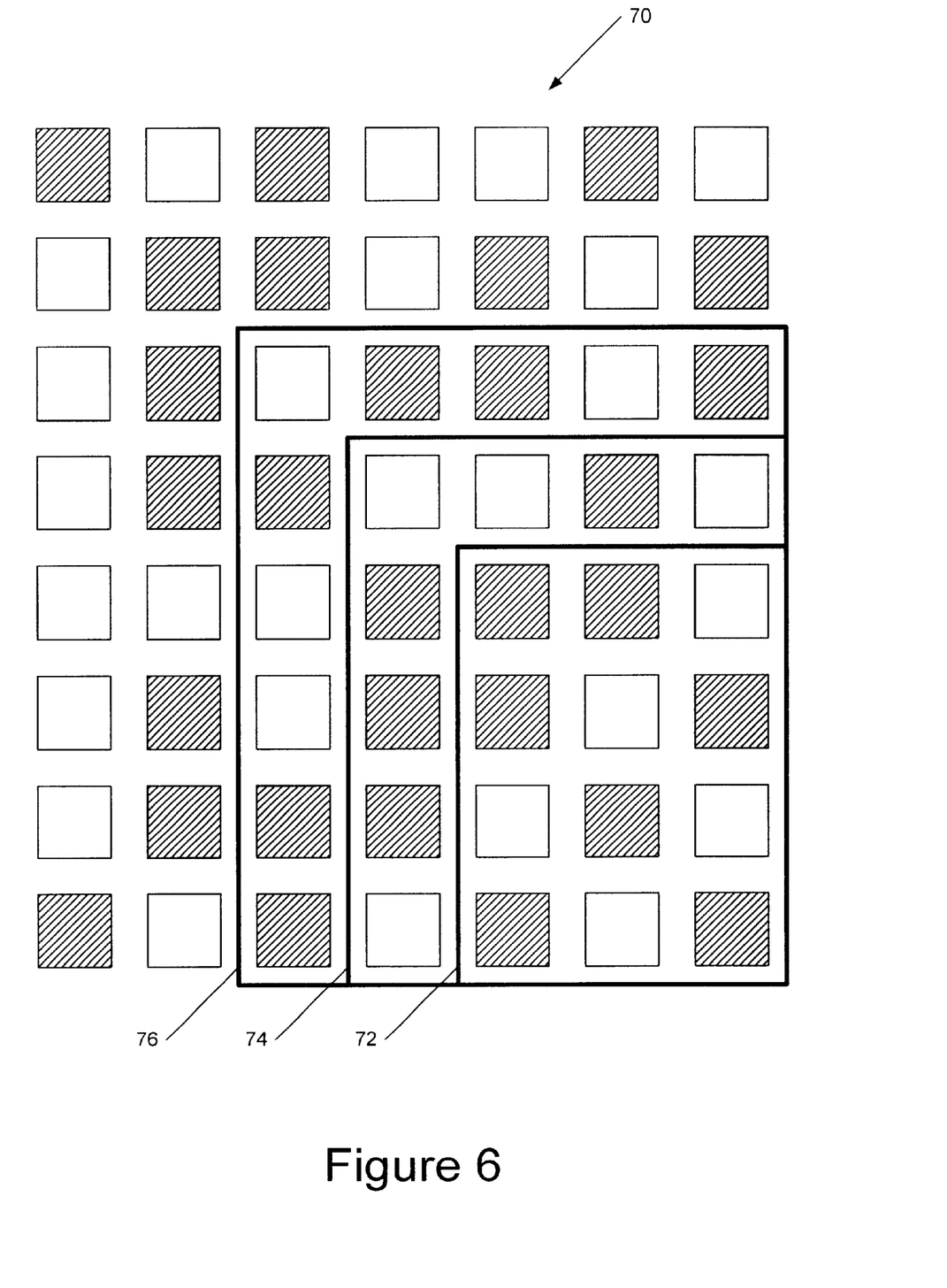
FIG. 6 is a top view of silicon carbide diodes according to alternative embodiments of the present invention.

Alternatively, rather than providing the devices on dies on the silicon carbide wafer, the devices could be distributed across a wafer or portion thereof and chips separated by sawing through spaces between the diodes or through unused diodes. Such a "sea of diodes" is illustrated in FIG. 6. As seen in FIG. 6, a plurality of diodes 70 are distributed across a silicon carbide wafer. Good diodes are shaded and bad diodes are not. Overlay pads of differing sizes may be used to interconnect the good diodes. Thus, for example, if a device of a specific current capability is desired, the overlay pad outlined by line 72 may be utilized. If higher current carrying capability is desired, the overlay pad outlined by line 74 may be utilized. Finally, if even higher current carrying capability is desired, the overlay pad outlined by line 76 may be utilized. The sizes of the overlay pads may be based on the map of good diodes resulting from the electrical testing. Furthermore, multiple overlay pads may be provided on a single wafer to provide multiple diodes from that wafer. Thus, for example, if 100A diodes are desired, multiple overlay pads of differing sizes may be used in a single wafer to provide a sufficient number of good diodes connected by each overlay pad so that all of the final devices satisfy the 100A criteria.

Figure 7:
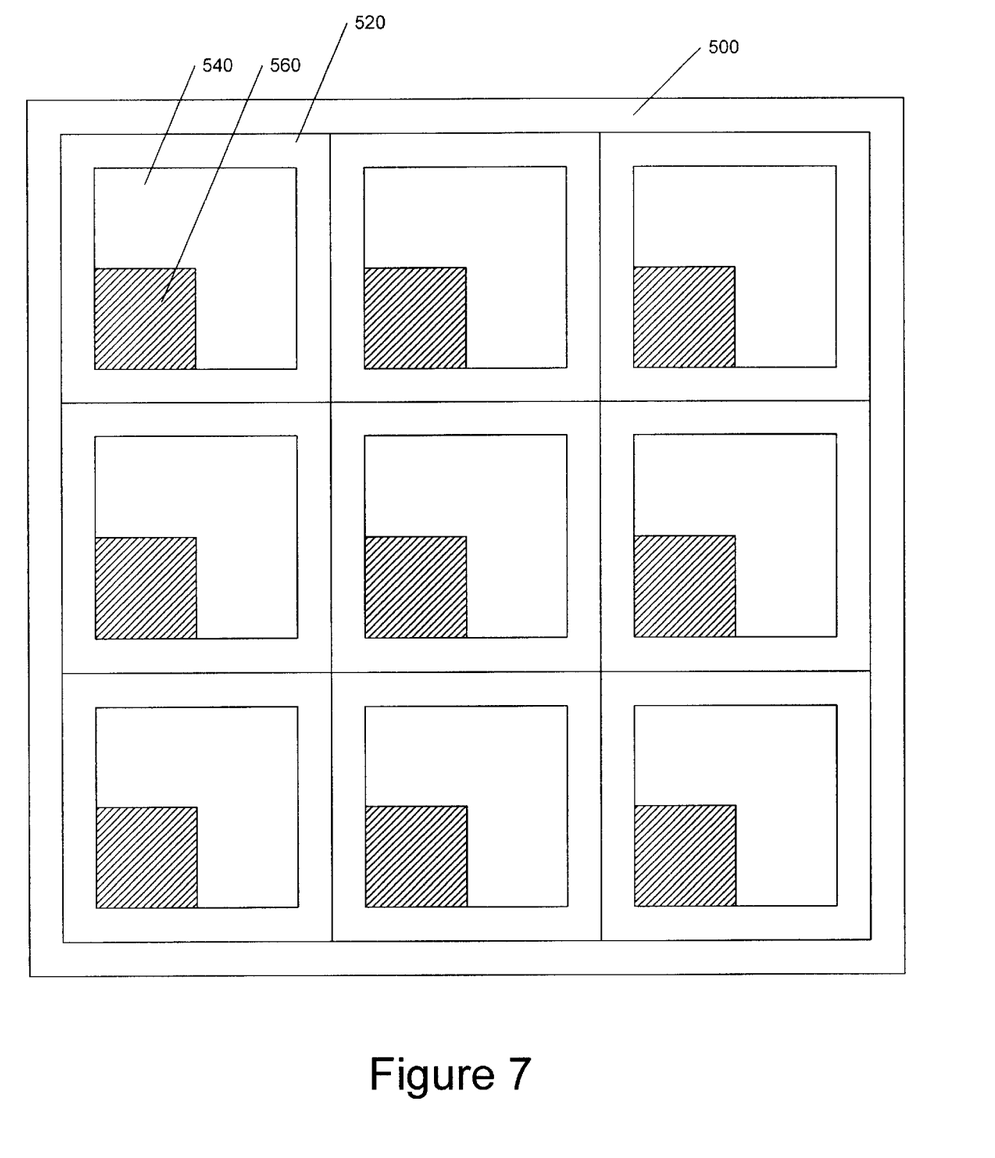
FIG. 7 is a top view of a silicon carbide die having a plurality of silicon carbide devices suitable for testing the silicon carbide devices according to embodiments of the present invention.

FIGS. 7 through 11 illustrate embodiments of the present invention where a plurality of silicon carbide switches are selectively connected in parallel based on electrical characteristics of individual ones of the plurality of silicon carbide switches. As seen in FIG. 7, a die 500 on a silicon carbide wafer has a plurality of silicon carbide switches 520. The silicon carbide switches 520 are illustrated as vertical devices having a common "back side" contact as a drain contact and two "top side" contacts, a source contact 540 and a gate contact 560. The silicon carbide switches 520 are electrically tested as described above with reference to the silicon carbide diodes to identify devices with a predefined electrical characteristic. As with the diodes described above, preferably the silicon carbide switches 520 are each edge terminated to isolate the devices from each other. Suitable edge termination techniques have been above with reference to the silicon carbide diodes and are identified in the United States Patents of silicon carbide devices identified above, the disclosures of which are incorporated herein by reference as if set forth fully herein.

Figure 8:
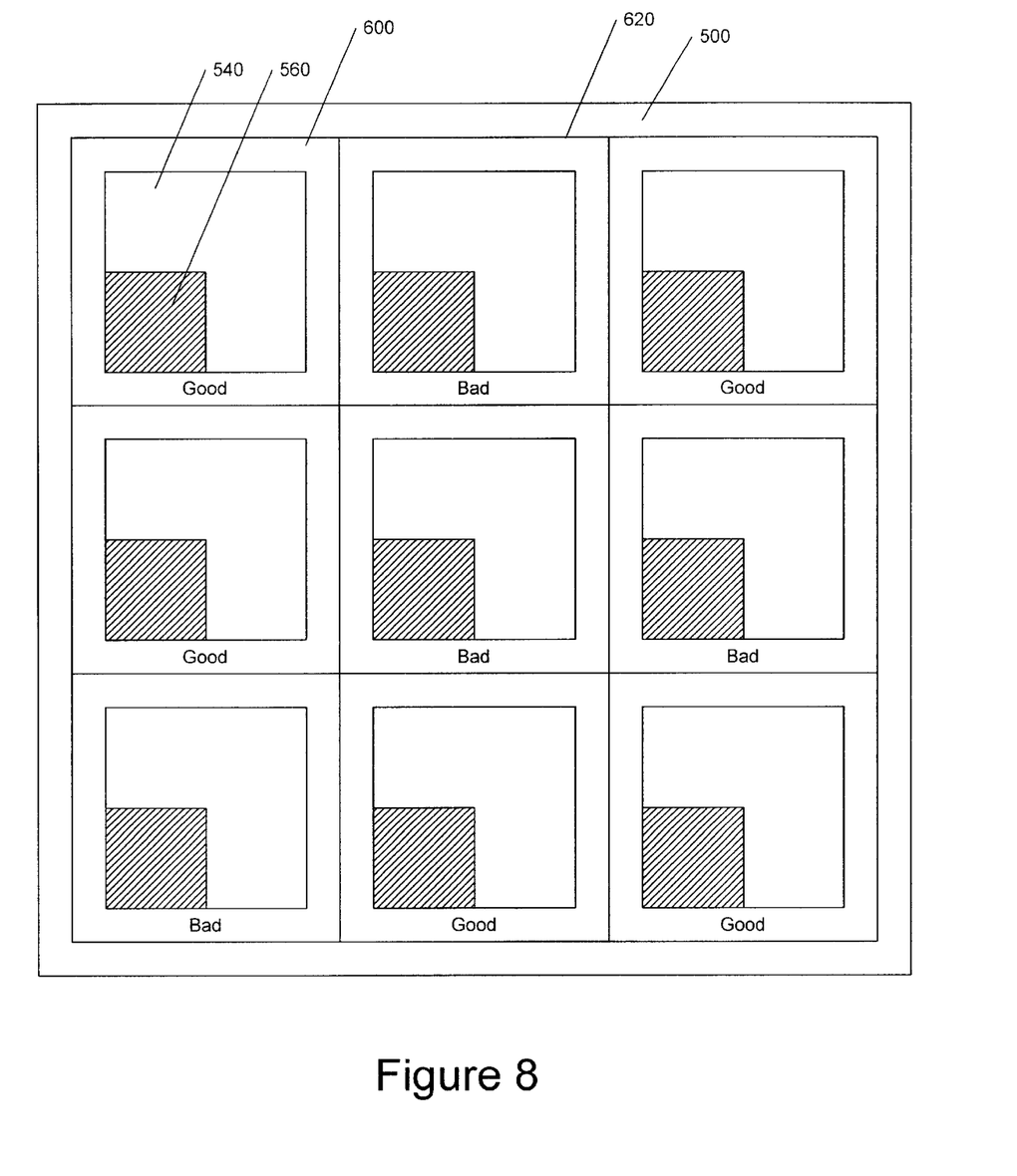
FIG. 8 is a top view of a silicon carbide die according to embodiments of the present invention indicating which of the plurality of silicon carbide devices have passed an electrical test.
Figure 9:
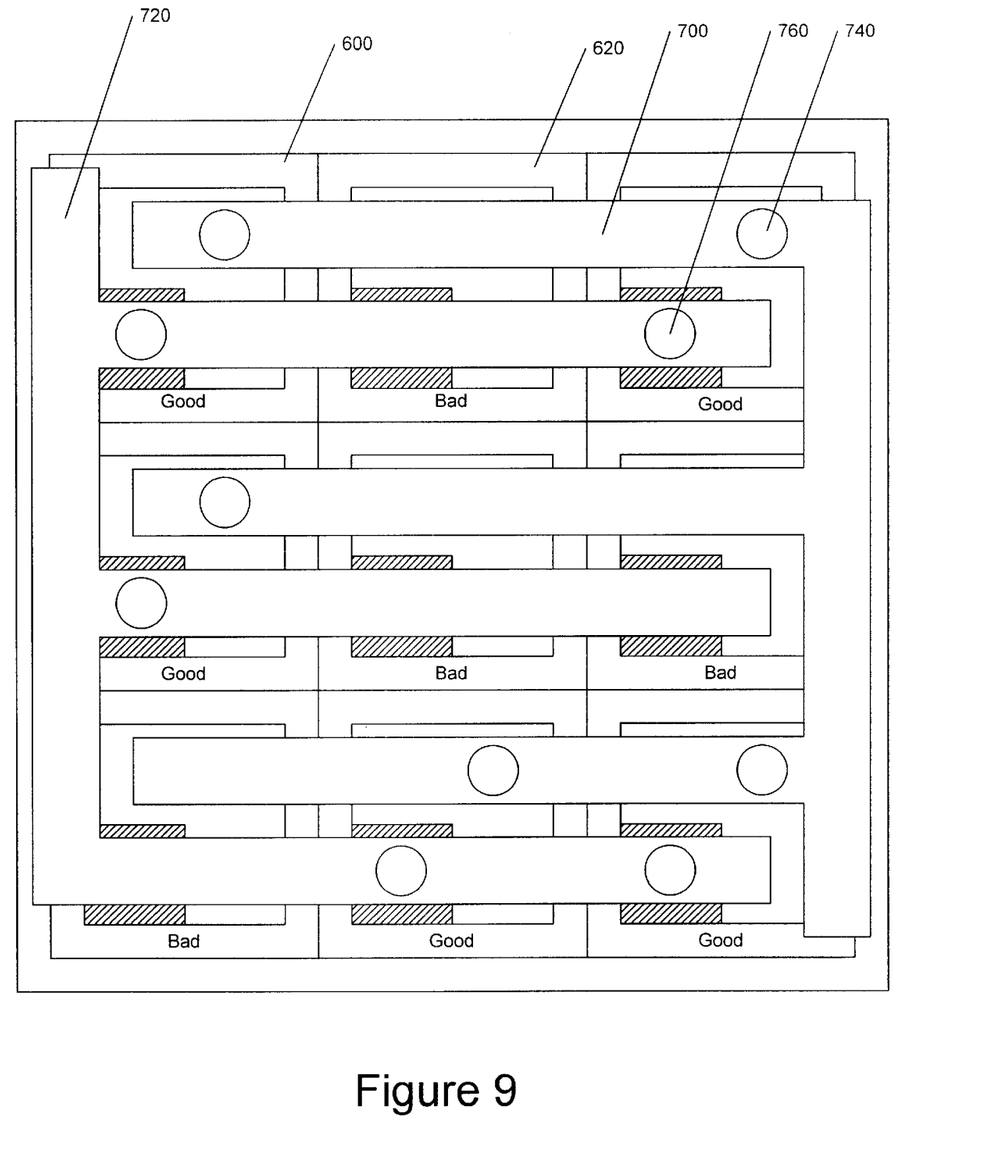
FIG. 9 is top view of a silicon carbide die according to embodiments of the present invention illustrating the selective interconnection of the silicon carbide devices which have passed the electrical test.

Devices which pass the electrical test are identified and a "map" of such good devices created to allow selective interconnection of the good devices. FIG. 8 illustrates devices 600 which have passed the electrical test are labeled as "good" and devices 620 which have not passed the electrical test are labeled as "bad." After an electrical test to identify good devices 600 and bad devices 620, a thick insulating layer, such as described above, is formed on all of the devices. FIG. 9 illustrates the selective interconnection of the good devices 600. A first via 740 for the source contact 540 and a second via 760 for the gate contact 560 are selectively formed through the insulating layer. Such vias 740 and 760 may be selectively formed by a stepper mask which includes a via mask for a single device which is repeatedly applied to regions of the die 500 of the good devices 600. A metal layer is formed on the insulating layer and into the vias to contact the underlying device contacts and is patterned so as to provide a gate interconnect layer 720 and a source interconnect layer 700. The interdigited structure illustrated in FIG. 9 may be utilized to selectively interconnect the gate contacts of good devices and the source contacts of good devices while maintaining isolation of the bad devices.

Figure 10:
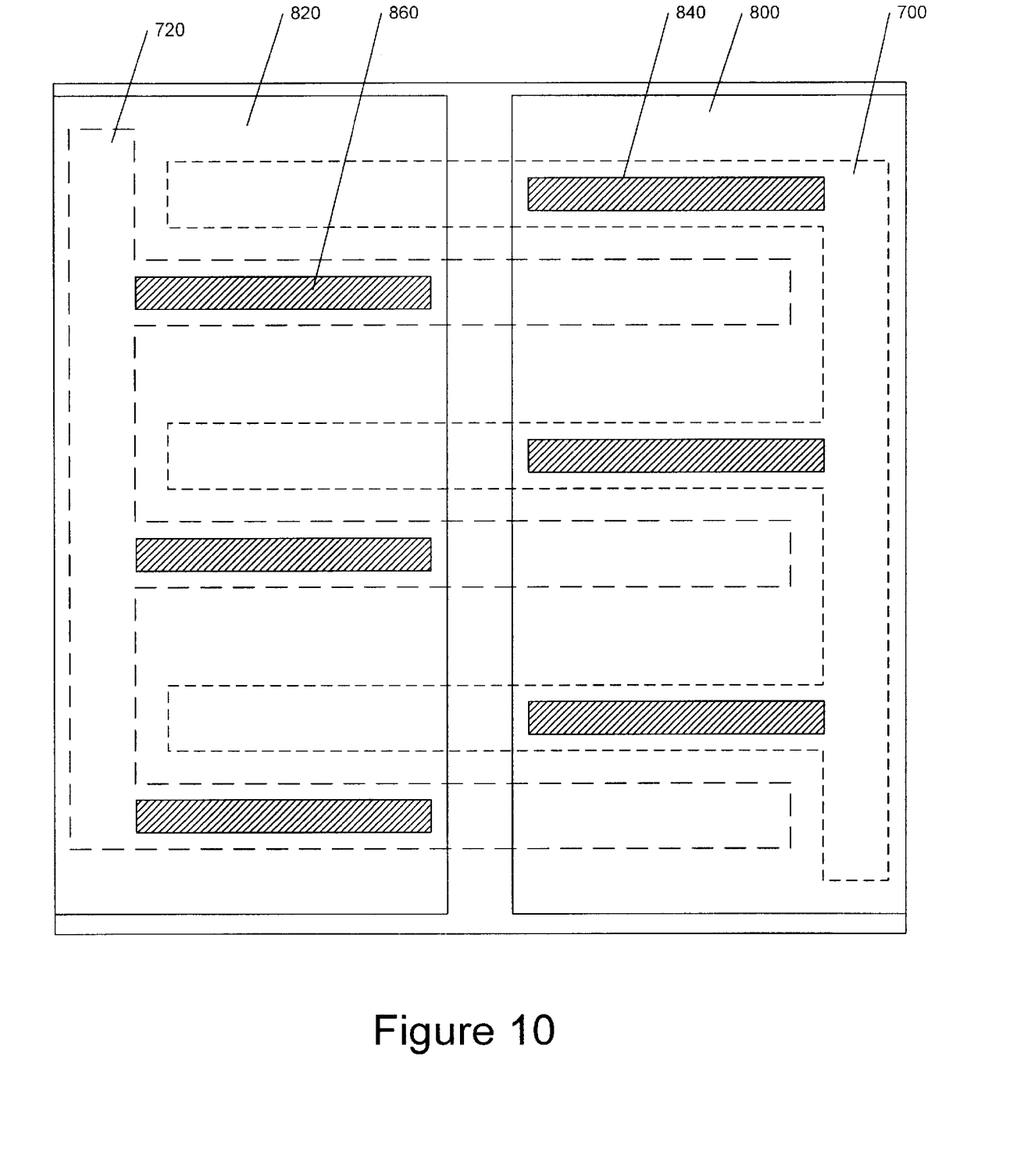
FIG. 10 is a top view of a silicon carbide device having a plurality of selectively interconnected silicon carbide devices according to embodiments of the present invention.

FIG. 10 illustrates formation of gate and source pads for the gate and source interconnect layers 700 and 720. A further insulating layer is provided on the interconnect layers 700 and 720 and vias 840 and 860 opened in the insulating layer to corresponding interconnect layers 700 and 720. A metal layer is formed on the insulating layer and into the vias to contact the underlying gate interconnect layer 720 and source interconnect layer 700 and is patterned to provide a source pad 800 and a gate pad 820.

Figure 11:
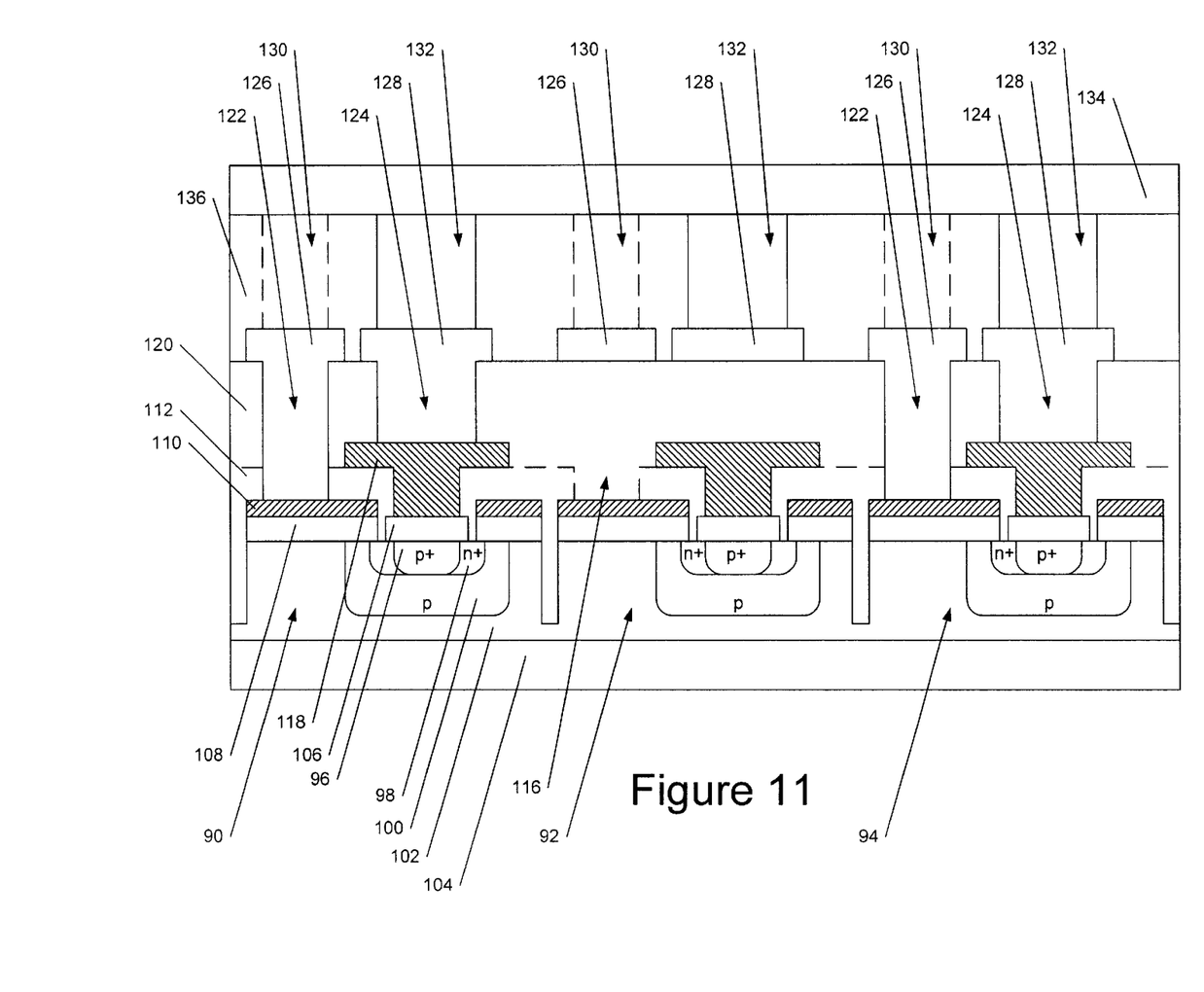
FIG. 11 is a cross-sectional view of a silicon carbide device according to embodiments of the present invention.

FIG. 11 is a cross-section of exemplary devices according to embodiments of the present invention. As seen in FIG. 11, a plurality of silicon carbide devices 90, 92 and 94 are selectively connected in parallel. The silicon carbide devices 90, 92 and 94 include a silicon carbide substrate 102 with a p-type region 100 therein. With the p-type region 100, an $n^+$ region 98 is provided and within the $n^+$ region 98 a $p^+$ region 96 is provided. Each of the regions 96, 98 and 100 are silicon carbide and may be provided utilizing conventional silicon carbide fabrication techniques. A source contact 106 is provided on the p+ region 96 and the n+ region 98. A gate oxide 108 is provided on the p-type region 100 and the n+ region 98 and a gate contact 110 provided on the gate oxide 108. A common drain contact 104 is provided on the substrate 102. As is further seen in FIG. 11, the devices 90, 92 and 94 are mesa edge terminated to isolate on device from the others. Fabrication of devices such as described above is described in U.S. patent application Ser. No. 09/911,995 entitled "SILICON CARBIDE METAL-OXIDE SEMICONDUCTOR FIELD EFFECT TRANSISTORS HAVING A SHORTING CHANNEL AND METHODS OF FABRICATING SILICON CARBIDE METAL-OXIDE SEMICONDUCTOR FIELD EFFECT TRANSISTORS HAVING A SHORTING CHANNEL", filed Jul. 21, 2001, the disclosure of which is incorporated herein by reference as if set forth fully herein.

As is further seen in FIG. 11, a first insulating layer 112 is provided on the devices an a via 116 opened in the first insulating layer 112 to expose the gate contacts 110 of the devices 90, 92 and 94. The first insulating layer 112 is illustrated by the dashed line in FIG. 11. Vias are also opened to expose the source contacts 106 of the devices 90, 92 and 94 and a source contact 118 provided. After electrical testing of the devices 90, 92 and 94, a second insulating layer 120 is formed on the first insulating layer and the source contact 118. Vias 124 are provided through the second insulating layer 120 to expose at least portions of the source contacts 118 of devices 90 and 94 which passed the electrical test(s) and vias 122 are provided through the second insulating layer 120 and the first insulating layer 112 to expose at least portions of the gate contacts 110 of devices 90 and 94. The vias 122 and 124 may be provided as described above utilizing a stepper mask or other such photolithographic technique. The vias 122 and 124 are filled with metallization and the metallization patterned to provide a gate interconnect layer 126 and a source interconnect layer 128. Thus, the devices 90 and 94 which have passed the electrical test(s) are selectively interconnect and the device 92 which did not pass the electrical test(s) is isolated from the other devices.

In the embodiments of the present invention illustrated in FIG. 11, contact pads are also provided for the source and the gate contact. While only one of such contact pads is illustrated in FIG. 11, a second contact pad may be provided in the third dimension of the figure which extends into and out of the plane illustrated. Thus, as seen in FIG. 11, a third insulating layer 136 is provided on the gate interconnect layer 126, the source interconnect layer 128 and the second insulating layer 120. Vias 130 are opened in the third insulating layer 136 to expose at least portions of the gate interconnect layer 126 and vias 132 are opened in the third insulating layer 136 to expose at least portions of the source interconnect layer 128. Metallization is provided through the vias 130 to provide a gate contact pad 134 and through the vias 132 to provide a source contact pad (not shown) for the commonly connected devices 90 and 94.

As an example of embodiments of the present invention, for a cell size of 2 mm×2 mm which, according to FIG. 1, will have an yield of ~50% for an overall defect density of 20 cm$^{-2}$. Each cell will have a rating of 600–2000V, 4 A at 100A/cm$^2$. Approximately 324 cells may be provided on a 50 mm wafer with an 80% useable area assuming a gap of 0.4 mm between adjacent cells. Approximately 8 good cells may be provided in a chip of 16 cells each. Thus, each chip would be expected to be capable of 600–2000V, 32 A. It would be expected that 20 such chips may be obtained from on a single wafer. In contrast, if a corresponding singe device with 600–2000V, 32 A capability were produced, the yield will be ~2.5%—approximately 1 device per wafer.

While the present invention has been described with reference to the particular structures illustrated in FIGS. 3 through 11, as will be appreciated by those of skill in the art in light of the present disclosure, various modifications may be made to such structures while still benefiting from the teachings of the present invention. For example, lateral devices may be provided where two, three or more terminals are provided on a side of the device. Similarly, in addition to the devices described herein, devices such as those identified in the above references patents or other such silicon carbide devices may also be provided. Accordingly, the present invention should not be construed as limited to the particular structures or devices described above.

Furthermore, while the present invention has been described with a stepper mask photolithographic process, as will be appreciated by those of skill in the art in light of the present disclosure, other photolithographic or patterning techniques could also be utilized to selectively interconnect only the devices which pass an electrical test. For example, lift-off or other such techniques could be utilized to provide vias for only those devices which pass the electrical test or tests.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating a silicon carbide device, comprising:

forming a plurality of a same type of silicon carbide devices on at least a portion of a silicon carbide wafer in a predefined pattern, the silicon carbide devices having corresponding first contacts on a first face of the silicon carbide wafer;

electrically testing the plurality of silicon carbide devices to identify ones of the plurality of silicon carbide devices which pass an electrical test; and selectively interconnecting the first contact of the identified ones of the plurality of silicon carbide devices by selectively applying a stepper mask so as to provide interconnection between the identified ones of the plurality of silicon carbide devices.

2. The method of claim 1, wherein selectively interconnecting the first contact comprises:

forming a passivation layer on the silicon carbide devices which covers the first contacts;

selectively applying a stepper mask to regions of the passivation layer corresponding to the first contacts for the identified ones of the plurality of silicon carbide devices so as to selectively form openings in the passivation layer corresponding to first contacts for the identified ones of the plurality of silicon carbide devices; and electrically connecting the first contacts through the selectively formed openings.

3. The method of claim 1, further comprising the step of selecting a device size to provide an expected yield of devices in silicon carbide such that a sufficient number of devices in a region of the silicon carbide wafer containing a plurality of silicon carbide devices will pass the electrical test so as to provide a silicon carbide device having a selected operating capability; and wherein the step of forming a plurality of a same type of silicon carbide devices comprises forming a plurality of a same type of silicon carbide devices of the selected device size.

4. The method of claim 2, wherein the silicon carbide devices comprise vertical silicon carbide diodes and the identified silicon carbide devices are identified silicon carbide diodes, the method further comprising the step of commonly connecting second contacts of the silicon carbide diodes.

5. The method of claim 4, wherein the step of electrically testing comprises the step of electrically testing a reverse bias blocking voltage of a silicon carbide diode of the plurality of silicon carbide diodes to determine if the reverse bias blocking voltage of the silicon carbide diode exceeds a predefined voltage value.

6. The method of claim 5, wherein the step of selectively applying a stepper mask comprises the steps of:

applying a stepper mask corresponding to one of the plurality of silicon carbide diodes to an identified one of the plurality of silicon carbide diodes; and repeating the step of applying the stepper mask for each of the identified silicon carbide diodes.

7. The method of claim 1, wherein the plurality of silicon carbide devices are provided in a plurality of dies on the silicon carbide wafer, the method further comprising dicing the silicon carbide wafer to provide a plurality of chips corresponding to the plurality of dies, ones of the plurality of chips having a plurality of selectively interconnected silicon carbide devices.

8. The method of claim 1, wherein the plurality of silicon carbide devices are distributed across the silicon carbide wafer and wherein the step of selectively interconnecting comprises selectively interconnecting a sufficient number of the silicon carbide devices to provide a desired operating characteristic utilizing an overlay pad the size of which is selected based on the desired operating characteristic and the number of the silicon carbide devices required to produce a silicon carbide device having the desired operating characteristic.

9. The method of claim 8, further comprising the step of forming a plurality of overlay pads on a wafer, the overlay pads having different sizes based on a number of silicon carbide devices in an area of the wafer corresponding to the overly pads which pass the electrical testing so as to provide a plurality of silicon carbide devices having the desired operating characteristic.

10. The method of claim 1, wherein the silicon carbide devices comprise silicon carbide devices having a second contact on the first face of the silicon carbide wafer, the method further comprising the step of selectively interconnecting second contacts of the identified ones of the silicon carbide devices utilizing the stepper mask.

11. The method of claim 10, wherein the silicon carbide devices are vertical silicon carbide devices having a third contact on a second face of the silicon carbide wafer opposite the first face, the method further comprising connecting the third contacts of the silicon carbide devices in parallel.

12. The method of claim 10, wherein the steps of selectively interconnecting the first contact and selectively interconnecting second contacts of the identified ones of the silicon carbide devices comprise:

forming a passivation layer on the silicon carbide devices which covers the first contacts;

selectively forming openings in the passivation layer corresponding to first contacts for the identified ones of the plurality of silicon carbide devices utilizing the first stepper mask;

selectively forming openings in the passivation layer corresponding to second contacts for the identified ones of the plurality of silicon carbide devices utilizing the stepper mask;

electrically connecting the first contacts through the selectively formed openings; and electrically connecting the second contacts through the selectively formed openings.

13. The method of claim 12, wherein the steps of selectively forming openings in the passivation layer corresponding to first contacts for the identified ones of the plurality of silicon carbide devices and selectively forming openings in the passivation layer corresponding to second contacts for the identified ones of the plurality of silicon carbide devices comprise the steps of:

applying the stepper mask corresponding to one of the plurality of silicon carbide devices to an identified one of the plurality of silicon carbide devices; and repeating the step of applying the stepper mask for each of the identified silicon carbide devices.

14. The method of claim 12, wherein the steps of electrically connecting the first contacts and electrically connecting the second contacts comprise electrically connecting the first contacts with a first interconnection metallization and electrically connecting the second contacts with a second interconnection metallization, the method further comprising the steps of:

forming an insulating layer on the first interconnection metallization and the second interconnection metallization;

forming at least one opening in the insulator corresponding to the first interconnection metallization utilizing the stepper mask;

forming a first contact pad on the insulating layer which contacts the first interconnection metallization through the at least one opening in the insulator corresponding to the first interconnection metallization;

forming at least one opening in the insulator corresponding to the second interconnection metallization utilizing the stepper mask; and forming a second contact pad on the insulating layer which contacts the second interconnection metallization through the at least one opening in the insulator corresponding to the second interconnection metallization.

15. The method of claim 10, wherein the silicon carbide devices comprise at least one of a metal-oxide semiconductor field effect transistor (MOSFET), a metal-semiconductor field effect transistor (MESFET), a junction field effect transistor (JFET), an insulated gate bipolar transistor (IGBT) and a bipolar junction transistor (BJT).

* * * * *